United States Patent
Huang et al.

(12)

(10) Patent No.: US 6,207,497 B1
(45) Date of Patent: Mar. 27, 2001

(54) CONFORMITY OF ULTRA-THIN NITRIDE DEPOSITION FOR DRAM CAPACITOR

(75) Inventors: Kuo-Tai Huang; Juan-Yuan Wu, both of Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/565,782

(22) Filed: May 5, 2000

(51) Int. Cl.[7] .................................................. H01L 21/8242
(52) U.S. Cl. ............................................ 438/253; 438/255
(58) Field of Search .................................. 438/253–256, 438/396–399

(56) References Cited

U.S. PATENT DOCUMENTS 5,985,730 * 11/1999 Lim ........................................ 438/393
5,998,824 * 12/1999 Lee ........................................ 257/309

* cited by examiner

*Primary Examiner*—Jey Tsai

(57) ABSTRACT

The present invention relates to a method for forming excellent conformity due to improved surface sensitivity. A substrate is providing on which a transistor is formed. Moreover, a blanket first dielectric layer is deposited over the substrate. Then, a first photoresist layer is formed over the dielectric layer, wherein the first photoresist layer is defined and etched to form a contact opening. Further, a first conductive layer is formed to fill the contact opening, and performing an etching process to remove the first conductive layer to form a node contact. Consequentially, a second conductive layer is deposited over the first dielectric layer and the node contact. A second photoresist layer is formed over the second conductive layer, wherein the second photoresist layer is defined and etched to form a storage node as an upper electrode of a capacitor. Next, a hemispherical silicon grain (HSG) is formed over and on a sidewall of the second conductive layer. Treating the hemispherical silicon grain (HSG) layer by rapid thermal nitration (RTN). And then a conformal second dielectric layer is deposited over the hemispherical silicon grain (HSG) and the first dielectric layer after rapid thermal nitration (RTN). Finally, a blanket third conductive layer is formed over the substrate to serve as an upper electrode of the capacitor.

42 Claims, 2 Drawing Sheets

CONFORMITY OF ULTRA-THIN NITRIDE DEPOSITION FOR DRAM CAPACITOR

BACKGROUND OF THE INVENTION

1. Field of the Invention

The present invention relates to a method for forming excellent conformity due to improved surface sensitivity

2. Description of the Prior Art

Recently, demand for dynamic random access memory (DRAM) has rapidly increased owing to widespread use of electronic equipment. In particular, it is applied relatively widely in the information industry in the computer hardware. In addition to being applied in the information industry, large-scale integration (LSI), very large scale integration (VLSI), and ultra large-scale integration (ULSI) must use greatly dynamic random access memory. In next century, the fabricated technology of the dynamic random access memory (DRAM) is still performed a primary role. Due to electronic, information, and communication product intent to light, thin, short, and quick, which high density and large capacity of the dynamic random access memory with demand is increased.

A memory device with higher cell density naturally has a higher memory capacity, and accordingly has a lower fabrication cost. In order to increase the memory capacity in a DRAM device, a strategy to increase a memory cell density is generally taken. A higher device density is usually achieved by reducing structures dimension of an integrated circuit (IC), such as line width, line pitch distance, transistor gate, or coupled capacitor.

A DRAM cell typically includes a field-effect transistor (FET) and a capacitor coupled to the FET. A DRAM device usually includes a large number of DRAM cells arranged in an array structure. Each DRAM cell can store one binary data through a capacitor charge status. A charged capacitor stores a binary data of "1", and a discharged capacitor stores a binary data of "0". Its coupled FET through a voltage status applied on its drain region does the action of charging or discharging. A desired FET can also be selected by a bit line and word line. The word line is typically coupled to each gate of the FETs in the DRAM array, and the bit line is typically coupled to each drain of the FETs of the DRAM array. The bit line provides the voltage status to the FET. The word line is used to turn on/off the FET. Through a selected pair of the bit line and the word line, a desired FET is selected and is written-in a binary data to the coupled capacitor. The stored binary data can also be read out by selecting the FET and switching the bit line to a compactor circuit to obtain the charge status of the coupled capacitor. The stored binary data in the selected DRAM cell is therefore obtained.

The capacitor stores charges on its lower and upper electrode surfaces, which are separated by a dielectric layer. The lower electrode is coupled to the source of the FET. The amount of stored charges in one capacitor depends on its capacitance. The capacitance is proportional to its electrode surface, such as the lower electrode surface, inversely proportional to the distance between the upper electrode and the lower electrode, and proportional to the dielectric constant.

In order to reduce the device dimension, the surface of the lower electrode is usually also reduced. In this manner, it capacitance is reduced. If the capacitance of the capacitor is reduced, a lot of issues may be induced. For example, a decay mechanism and a charge leakage may cause an error content of the stored binary data due to a small quantity of stored charges, which therefore has small tolerance of charge variance. Generally, in order to prevent the error content of the stored binary data, the capacitor is necessarily refreshed in a certain period of time, which is also called a refreshing cycle time. If the capacitance is smaller, the refreshing cycle time is shorter, and the refreshing process is necessarily more often performed. During each time of the refreshing process, the DRAM can not fulfills its function. This is called a dead time. A smaller capacitance has more dead time, and the efficiency of the DRAM performance is reduced. Moreover, a smaller capacitance needs a more sensitive amplifier, which results in a more complicated circuit and greater fabrication cost.

It was found that nitride this down to the very scale would result in an unexpected high resistance in capacitor node. This high resistance was attributed to poly grain oxidation in storage neck area. This phenomenon is more severe as node critical dimension decreases. It was also found that the issue of surface sensitivity is more serious for thinner nitride deposition, highly possible to enable oxidation path through poly/oxide interface. Some evidence also supports this hypothesis such as alleviating surface sensitivity during nitride deposition and adding additional thin nitride layer between storage node (SN) and IPD.

SUMMARY OF THE INVENTION

In accordance with the present invention, a method is provided for improving conformity of ultra-thin nitride deposition for the DRAM capacitor.

In one objective of the present invention, a method for forming excellent conformity due to improved surface sensitivity. Due to more effective nitridization treated by rapid thermal nitridation (RTN) or treated plasma, nitride conformity between HSG and IPD has been improved. So surface material on HSG and IPD is more close and incubation period for nitride deposition is close. This can retard the oxidation path effectively and RC of node contact is improved a lot by this method.

A further objective of the present invention is to provide, a method for forming excellent conformity due to improved surface sensitivity. A substrate is provided on which a transistor is formed. Moreover, a blanket first dielectric layer is deposited over the substrate. Then, a first photoresist layer is formed over the dielectric layer, wherein the first photoresist layer is defined and etched to form a contact opening. Further, a first conductive layer is formed to fill the contact opening, and performing an etching process to remove the first conductive layer to form a node contact. Consequentially, a second conductive layer is deposited over the first dielectric layer and the node contact. A second photoresist layer is formed over the second conductive layer, wherein the second photoresist layer is defined and etched to form a storage node as an upper electrode of a capacitor. Next, a hemispherical silicon grain (HSG) is formed over and on a sidewall of the second conductive layer. The hemispherical silicon grain (HSG) layer is treated by rapid thermal nitration (RTN). And then a conformal second dielectric layer is deposited over the hemispherical silicon grain (HSG) and the first dielectric layer after rapid thermal nitration (RTN). Finally, a blanket third conductive layer is formed over the substrate to serve as an upper electrode of the capacitor.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
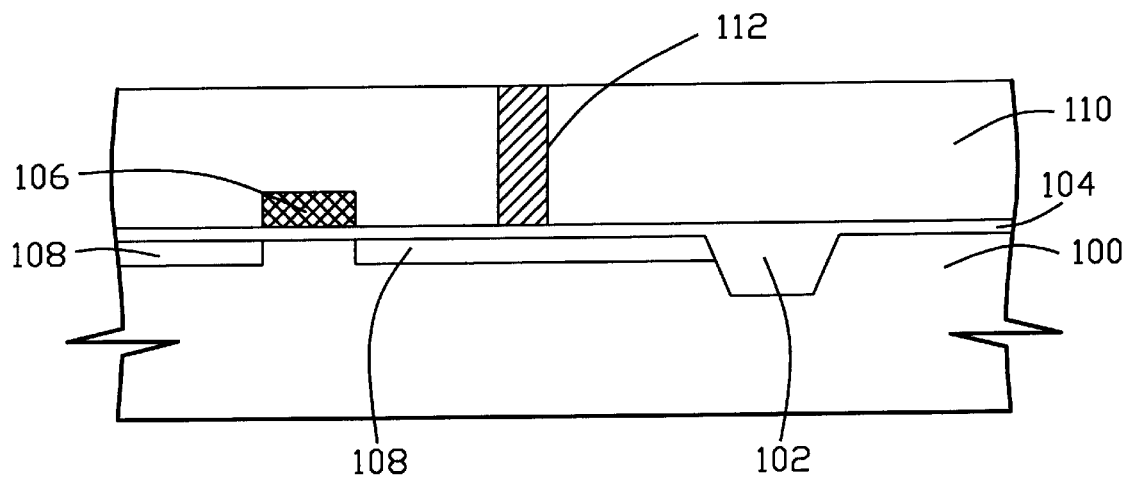
FIGS. 1 to 3 show cross-sectional views illustrative of various stages in the fabrication in accordance with one embodiment of the present invention.
Figure 2:
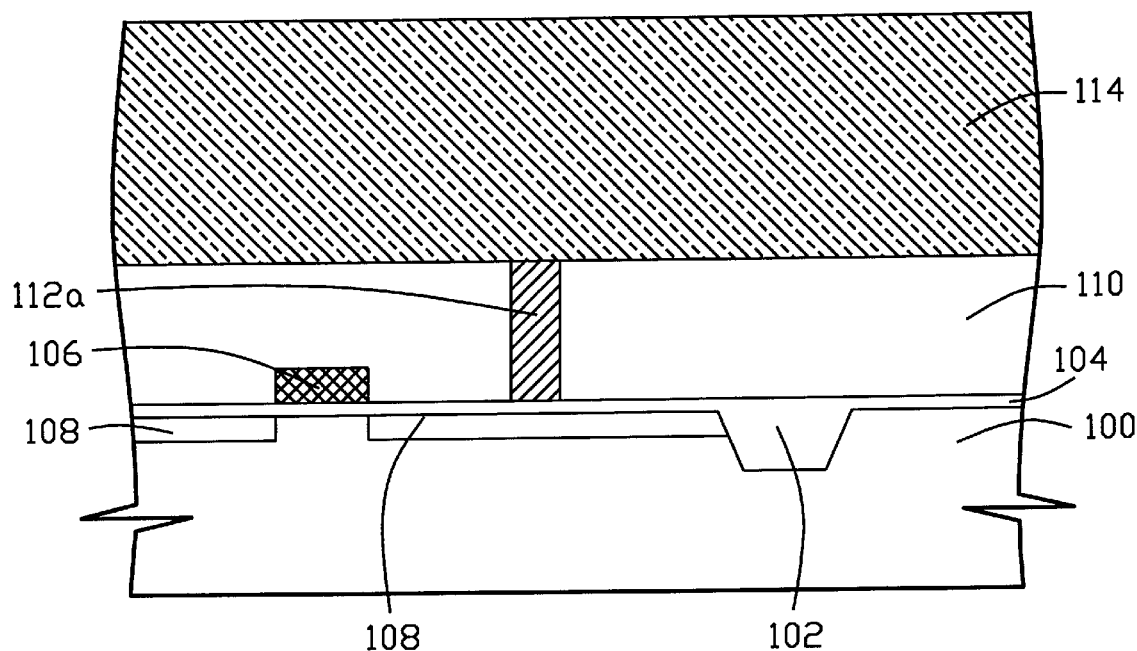
Figure 3:
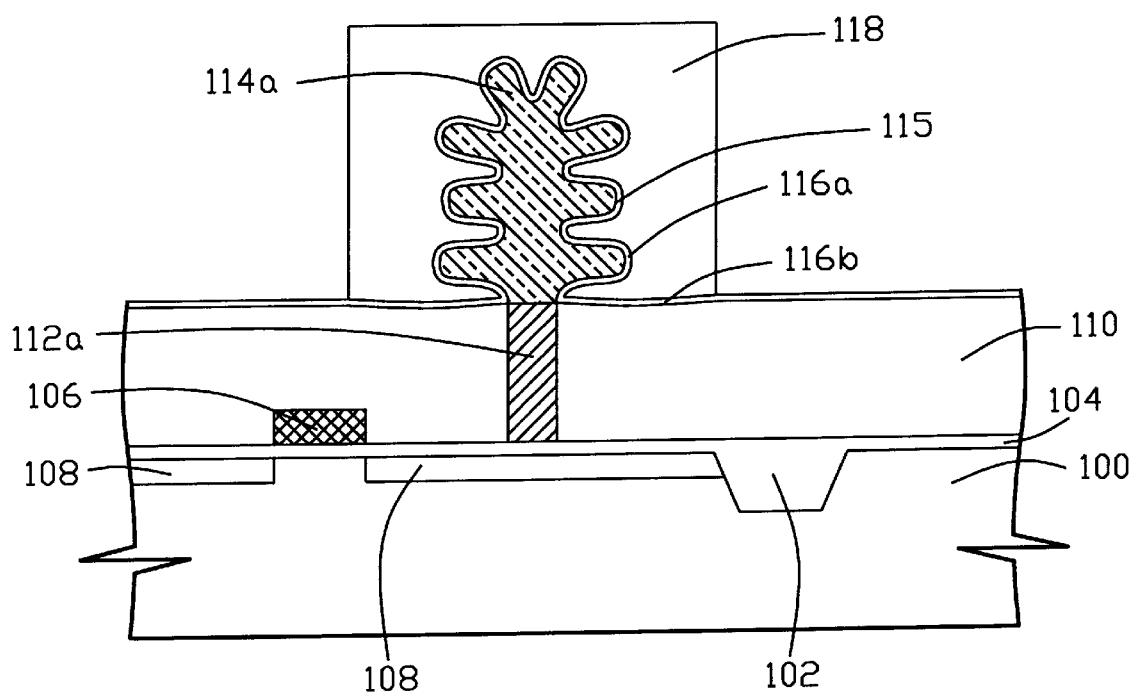

Referring to FIGS. 1 to 3, the process flow of a preferred embodiment according to the present invention is depicted in cross-sectional views. These drawings merely show several key steps in sequential processes.

Referring to FIG. 1, a silicon substrate 100 is shown incorporating a device on which a metal-oxide semiconductor (MOS) transistor is formed. And then a plurality of field oxides 102 are formed on the silicon substrate 10, one of the field oxides is spaced from another of the field oxide by a MOS structure. A gate 106, a gate oxide layer 104, and an interchangeable source/drain region 108 serving together as a metal-oxide semiconductor (MOS) transistor are formed on a semiconductor substrate 100. A shallow trench isolation (STI) structure 102 is also formed in the substrate 100 to isolate the MOS transistor. A blanket inter-poly dielectric layer (IPD) 110 is formed over the silicon substrate 100 by chemical vapor deposition (CVD). Moreover, a photoresist layer (not shown) is formed over the inter-poly dielectric layer 110, wherein the photoresist layer is defined and etched to form a contact opening 112 by an anisotropic etch. Then the contact plug 112 is formed in inter-poly dielectric layer 110 to have an electrically coupling to the interchangeable source/drain region 108. Further, a metal conductive layer 112a is deposited above the inter-poly dielectric layer 110 and fills the contact opening 112, and then an etching process is performed to remove the metal conductive layer to form a node contact as a bottom electrode of a capacitor by etch back. The metal conductive layer 112a comprises one of the following: Aluminum (Al), Copper (Cu), Tungsten (W). Subsequently, in this embodiment, first doped polysilicon layer 114 is deposited over the inter-poly dielectric layer 110 and the node contact 112a by a standard chemical vapor deposition (LPCVD) technique.

Referring to FIG. 2, a second photoresist layer (not shown) is formed on first doped polysilicon layer 114, and the main first doped polysilicon layer 114 is etched that the residue of first doped polysilicon layer 114a is formed a storage node as an upper electrode of a capacitor as shown in FIG. 3. The doped polysilicon layer 114a is composed of silicon. Further, a plurality of nucleation spread into the doped polysilicon layer 114a to form a hemispherical silicon grain (HSG) over and on a sidewall of the doped polysilicon layer 114a. Next, treating the hemispherical silicon grain (HSG) by rapid thermal nitration (RTN) to replace conventional soaking process by furnace. Moreover, a conformal silicon nitride layer 116a depositing over said hemispherical silicon grain (HSG) 115 and the upper surface of the inter-poly dielectric layer 110 after rapid thermal nitration (RTN). The thickness of the silicon nitride 116a in hemispherical silicon grain (HSG) 115 is about 60 angstroms, and then 40–60 angstroms was formed in the upper surface of inter-poly dielectric layer 110. In a conventional method, the thickness of the silicon nitride 116a in hemispherical silicon grain (HSG) 115 is about 60 angstroms, but only 20–30 angstroms was formed in the upper surface of inter-poly dielectric layer 110. Due to the effective nitridization treated by rapid thermal nitration (RTN), the silicon nitride layer conformity between the hemispherical silicon grain (HSG) 116a and the inter-poly dielectric layer 116b have been improved. The method of the present invention further comprises a soaking process after rapid thermal nitration (RTN) and before the conformal silicon nitride layer. The soaking process comprises ammonia ($NH_3$) and nitrogen ($N_2$), and the ratio of ammonia ($NH_3$) and nitrogen ($N_2$) is about 30–50 in between about 600° C. and 850° C. Only ammonia soaking in furnace is not effective for the silicon nitride in inter-poly dielectric layer and result in nitridization surface material difference between HSG 115 and IPD 110, and poor nitride conformity. Finally, a blanket doped polysilicon layer 118 is formed over the silicon substrate 100 to serve as an upper electrode of the capacitor. Another embodiment of the present invention for improving conformity is treating the hemispherical silicon grain (HSG) 115 by ammonia ($NH_3$) and nitrogen ($N_2$) plasma or remote plasma after forming a hemispherical silicon grain (HSG). This invention for most effective nitridation method to alleviate this conformity issue. Due to the treating of the hemispherical silicon grain (HSG) 115 by ammonia ($NH_3$) and nitrogen ($N_2$) plasma or remote plasma after forming a hemispherical silicon grain (HSG) 115, the thickness of HSG 115 and IPD 110 are similar nitride thickness. So this can retard oxidation path effectively and RC of node contact is improved a lot by this method.

Although specific embodiments have been illustrated and described, it will be obvious to those skilled in the art that various modifications may be made without departing from what is intended to be limited solely by the appended claims.

What is claimed is:

1. A method for fabricating a DRAM cell, the method comprising:

providing a substrate;

depositing a blanket first dielectric layer over the substrate;

forming a first photoresist layer over said first dielectric layer, wherein said first photoresist layer is defined and etched to form a contact opening in the first dielectric layer;

forming a first conductive layer to fill said contact opening, and performing an etching process to remove a portion of said first conductive layer to form a node contact;

depositing a second conductive layer over said first dielectric layer and the node contact;

forming a second photoresist layer over said second conductive layer, wherein said second photoresist layer is defined and etched to form a storage node as an upper electrode of a capacitor;

forming a hemispherical silicon grain (HSG) over and on a sidewall of said second conductive layer;

treating said hemispherical silicon grain (HSG) layer by rapid thermal nitration (RTN);

depositing a conformal second dielectric layer over said hemispherical silicon grain (HSG) and said first dielectric layer after rapid thermal nitration (RTN); and forming a blanket third conductive layer over said substrate to serve as the upper electrode of the capacitor.

2. The method in accordance with claim 1 further comprises a soaking process after rapid thermal nitration (RTN) and before the conformal second dielectric layer.

3. The method in accordance with claim 2, wherein said soaking process comprises ammonia ($NH_3$) and nitrogen ($N_2$) in between about 600 and 850° C.

4. The method according to claim 1, wherein said first dielectric layer comprises inter-poly dielectric (IPD) layer.

5. The method according to claim 4, wherein said inter-poly dielectric layer comprises silicon dioxide.

6. The method according to claim 1, wherein said second dielectric layer comprises silicon nitride layer.

7. The method according to claim 1, wherein said node contact comprises one of the following: Aluminum (Al), Copper (Cu), Tungsten (W).

8. The method according to claim 1, wherein said storage node comprises doped polysilicon.

9. The method according to claim 1, wherein said third conductive layer comprises doped polysilicon.

10. The method according to claim 1, wherein said first, said second, and third conductive layers chemical vapor deposition (CVD).

11. The method according to claim 1, wherein the step of patterning the first dielectric layer to form the contact opening comprises anisotropy etching.

12. The method according to claim 1, wherein the steps of forming the HSG comprises silicon.

13. A method for fabricating a DRAM cell, the method comprising:
   providing a substrate;
   depositing a blanket first dielectric layer over the substrate;
   forming a first photoresist layer over said first dielectric layer, wherein said first photoresist layer is defined and etched to form a contact opening in the first dielectric layer;
   forming a first conductive layer to fill said contact opening, and performing an etching process to remove a portion of said first conductive layer to form a node contact;
   depositing a second conductive layer over said first dielectric layer and the node contact;
   forming a second photoresist layer over said second conductive layer, wherein said second photoresist layer is defined and etched to form a storage node as an upper electrode of a capacitor;
   forming a hemispherical silicon grain (HSG) over and on a sidewall of said second conductive layer;
   treating said hemispherical silicon grain (HSG) by plasma;
   depositing a conformal second dielectric layer over said hemispherical silicon grain (HSG) and said first dielectric layer after treating plasma; and
   forming a blanket third conductive layer over said substrate to serve as the upper electrode of the capacitor.

14. The method in accordance with claim 13 further comprises a soaking process after treating plasma and before the conformal second dielectric layer.

15. The method in accordance with claim 13, wherein said soaking process comprises ammonia ($NH_3$) and nitrogen ($N_2$) in between about 600 and 850° C.

16. The method according to claim 13, wherein said first dielectric layer comprises inter-poly dielectric (IPD) layer.

17. The method according to claim 13, wherein said inter-poly dielectric layer comprises silicon dioxide.

18. The method according to claim 13, wherein said second dielectric layer comprises silicon nitride layer.

19. The method according to claim 13, wherein said node contact comprises one of the following: Aluminum (Al), Copper (Cu), Tungsten (W).

20. The method according to claim 13, wherein said storage node comprises doped polysilicon.

21. The method according to claim 13, wherein said third conductive layer comprises doped polysilicon.

22. The method according to claim 13, wherein said first, said second, and third conductive layers chemical vapor deposition (CVD).

23. The method according to claim 13, wherein the step of patterning the first dielectric layer to form the contact opening comprises anisotropy etching.

24. The method according to claim 13, wherein the steps of forming the HSG comprises silicon.

25. The method according to claim 13, wherein said plasma further comprises remote plasma.

26. A method for fabricating a DRAM cell, the method comprising:
   providing a silicon substrate on which a transistor is formed;
   depositing a blanket inter-poly dielectric layer (IPD) over the silicon substrate;
   forming a first photoresist layer over said inter-poly dielectric layer, wherein said first photoresist layer is defined and etched to form a contact opening in said inter-poly dielectric layer (IPD);
   forming a metal conductive layer to fill said contact opening, and performing an etching process to remove a portion of said metal conductive layer to form a node contact;
   depositing a first doped polysilicon layer over said first inter-poly dielectric layer and the node contact;
   forming a second photoresist layer over said first doped polysilicon layer, wherein said second photoresist layer is defined and etched to form a storage node as an upper electrode of a capacitor;
   forming a hemispherical silicon grain (HSG) over and on a sidewall of said first doped polysilicon layer;
   treating said hemispherical silicon grain (HSG) by rapid thermal nitration (RTN);
   depositing a conformal silicon nitride layer over said hemispherical silicon grain (HSG) and said inter-poly dielectric layer after rapid thermal nitration (RTN); and
   forming a blanket second doped polysilicon layer over said silicon substrate to serve as the upper electrode of the capacitor.

27. The method in accordance with claim 26 further comprises a soaking process after rapid thermal nitration (RTN) and before the conformal second dielectric layer.

28. The method in accordance with claim 26, wherein said soaking process comprises ammonia ($NH_3$) and nitrogen ($N_2$) in between about 600 and 850° C.

29. The method according to claim 26, wherein said interpoly dielectric layer (IPD) comprises silicon dioxide.

30. The method according to claim 26, wherein said node contact comprises one of the following: Aluminum (Al), Copper (Cu), Tungsten (W).

31. The method according to claim 26, wherein the step of patterning the inter-poly dielectric layer (IPD) to form the contact opening comprises anisotropy etching.

32. The method according to claim 26, wherein the steps of forming the HSG layer comprises silicon.

33. A method for fabricating a DRAM cell, the method comprising:
   providing a silicon substrate on which a transistor is formed;
   depositing a blanket inter-poly dielectric layer (IPD) over the silicon substrate;
   forming a first photoresist layer over said inter-poly dielectric layer, wherein said first photoresist layer is defined and etched to form a contact opening in said inter-poly dielectric layer;

forming a metal conductive layer to fill said contact opening, and performing an etching process to remove a portion of said metal conductive layer to form a node contact;

depositing a first doped polysilicon layer over said first inter-polysilicon layer and the node contact;

forming a second photoresist layer over said first doped polysilicon layer, wherein said second photoresist layer is defined and etched to form a storage node as an upper electrode of a capacitor;

forming a hemispherical silicon grain (HSG) over and on a sidewall of said first doped polysilicon layer;

treating said hemispherical silicon grain layer by plasma;

depositing a conformal silicon nitride layer over said hemispherical silicon grain (HSG) and said inter-poly dielectric layer after treating plasma; and forming a blanket second doped polysilicon over said silicon substrate to serve as the upper electrode of the capacitor.

34. The method in accordance with claim 33 further comprises a soaking process after treating plasma and before the conformal silicon nitride layer.

35. The method in accordance with claim 33, wherein said soaking process comprises ammonia (NH3) and nitrogen (N2) in between about 600 and 850° C.

36. The method according to claim 33, wherein said interpoly dielectric layer (IPD) comprises silicon dioxide.

37. The method according to claim 33, wherein said metal conductive layer comprises one of the following: Aluminum (Al), Copper (Cu), Tungsten (W).

38. The method according to claim 33, wherein said metal conductive layer, said first doped polysilicon layer, and second doped polysilicon layers chemical vapor deposition (CVD).

39. The method according to claim 33, wherein the step of patterning the inter-poly dielectric layer to form the contact opening comprises anisotropy etching.

40. The method according to claim 33, wherein the steps of forming the HSG layer comprises silicon.

41. The method according to claim 33, wherein said plasma comprises ammonia (NH3) and nitrogen (N2).

42. The method according to claim 33, wherein said plasma further comprises remote plasma.

* * * * *